United States Patent [19]

Gohla et al.

[11] Patent Number: 4,782,785
[45] Date of Patent: Nov. 8, 1988

[54] SYSTEM FOR PRODUCING SEMICONDUCTOR LAYER STRUCTURES BY WAY OF EPITAXIAL GROWTH

[75] Inventors: Bernward Gohla, Stuttgart; Richard Linnebach, Erdmannhausen, both of Fed. Rep. of Germany

[73] Assignee: Alcatel N.V., Amsterdam, Netherlands

[21] Appl. No.: 945,235

[22] Filed: Dec. 23, 1986

Related U.S. Application Data

[63] Continuation of Ser. No. 757,216, Jul. 19, 1985, abandoned.

[30] Foreign Application Priority Data

Jul. 23, 1984 [DE] Fed. Rep. of Germany ....... 3427056

[51] Int. Cl.$^4$ ................... B05C 11/115; B05C 3/18; B05C 13/02
[52] U.S. Cl. ................................... 118/696; 118/64; 118/412; 118/415
[58] Field of Search ............. 118/50.1, 412, 415, 118/697, 64, 696; 156/622, 624; 148/171, 172

[56] References Cited

U.S. PATENT DOCUMENTS

| | | | |
|---|---|---|---|
| 3,993,963 | 11/1976 | Logan et al. | 148/172 X |
| 4,013,040 | 3/1977 | Horikoshi | 148/172 X |
| 4,028,148 | 6/1977 | Horikoshi | 148/172 X |
| 4,347,097 | 8/1982 | Nishizawa | 156/622 |

FOREIGN PATENT DOCUMENTS 2211846 9/1973 Fed. Rep. of Germany .

OTHER PUBLICATIONS

"Ventile," Catalog of Leybold-Heraeus GmbH, No. 176.1.1, HV 200, Section 6, Supplementary Edition, Jun. 1983, pp. 6.2–6.23.
"Vauum Valves," Catalog of Leybold-Heraeus GmbH, No. 176.1.2, HV 250, Section 6, Jan. 1986, pp. 6.2, 6.1.2 and 6.13.
Derwent Abstract of DE-OS 2,211,846.

*Primary Examiner*—Evan Lawrence
*Attorney, Agent, or Firm*—Spencer & Frank

[57] ABSTRACT

An upper crucible part comprises several chambers containing a supersaturated growth solution with which a semiconductor wafer is coated with a monocrystalline semiconductor layer by way of epitaxial growth. The semiconductor wafer is contained in a cassette-shaped lower part which is moved underneath the upper part. The coating itself is effected within a protective-gas atmosphere within a reaction space which, by a diffusion furnace, is heated up to a temperature which is very exactly adhered to. In order to avoid a frequent cooling of the reaction space due to exposure to the ambient temperature and subsequent re-heating, the system comprises a loading station into which several lower crucible parts together with the semiconductor wafers, with the exclusion of air, are introduced into the reaction space and an epitaxial-growth region through which the lower crucible parts are moved successively below the stationarily arranged crucible part, as well as an unloading station in which the lower crucible parts, with the exclusion of air, are removed from the reaction space.

8 Claims, 3 Drawing Sheets

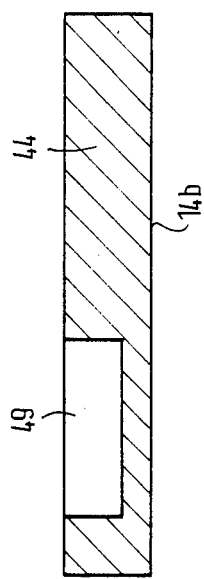
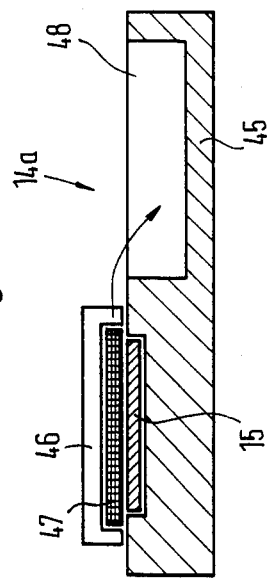
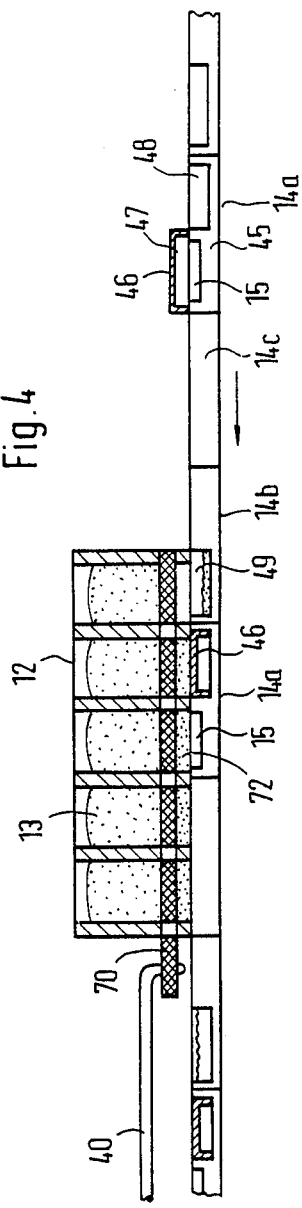

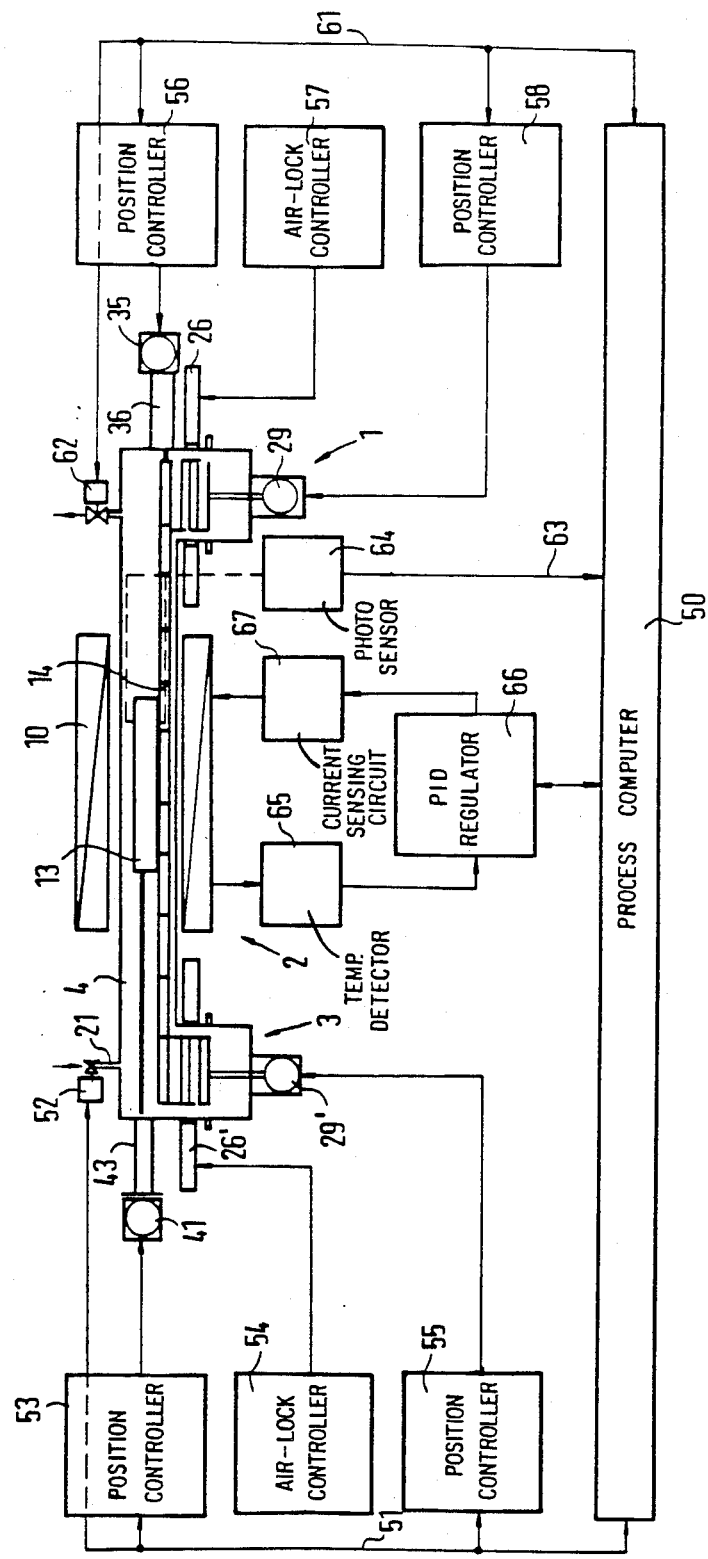

SYSTEM FOR PRODUCING SEMICONDUCTOR LAYER STRUCTURES BY WAY OF EPITAXIAL GROWTH

This is a continuation of application Ser. No. 757,216 filed July 19, 1985 now abandoned.

BACKGROUND OF THE INVENTION

The invention relates to a system for producing semiconductor layer structures by way of epitaxial growth.

It is known to produce semiconductor devices consisting of several layers, by way of epitaxial growth. A substrate in the form of a thin semiconductor crystal platelet—usually referred to as a wafer—is acted upon, in a crucible, by an undercooled or supersaturated molten solution of another semiconductor material. The atoms of the coating substance which settle out of the solution deposit on the surface of the substrate and form thereon a thin monocrystalline layer which may have a small number of lattice defects and, consequently, good physical properties. This conventional process which, within the English language community, is referred to as the LPE (liquid phase epitaxy) process is used, for example, to produce quaternary mixed-crystal layer structures for use with electro-optical devices. As examples of such devices, there are lasers, LEDs and photodetectors on the basis of gallium-indium-arsenide-phosphide (Ga-In-As-P).

Conventional systems of the type mentioned hereinbefore (Journal of Crystal Growth 46 (1979) pp. 253 to 261; British Telecom Technology Journal Vol. 1 No. 1, July 1983, pp. 23 to 30) are provided with reaction spaces which are accessible from one side and which, in their insides, contain epitaxy crucibles in the form of a so-called multi-chamber sliding boat. In the lower part thereof, there is contained the uncoated substrate, and the upper part comprises several chambers containing the portioned solutions of the required coating substances. The upper part is pushed over the lower part, with the contents of the individual chambers remaining over the substrate for the respectively required periods of time. Crucibles are also known, from the chamber contents of which, with the aid of a slider, each time one solution portion can be separated, which is then sufficient for coating a wafer (Journal of Crystal Growth 60 (1982), pp. 421 to 433). For removing the used up solution, however, the crucible has to be removed from the reaction space. For this purpose, the furnace must each time be cooled and thereafter heated up again. This results in long idle times for the system and also in heat-energy losses.

SUMMARY OF THE INVENTION

It is an object of the invention to provide a system of the type mentioned hereinbefore which permits the production of large quantities of semiconductor devices having layer structures.

Through the invention, a quasi-continuous large-scale production of optical semiconductor devices is made possible. Owing to the fact that the regular complete cooling down to room temperature and the subsequently following reheating of the furnace can be omitted, there is obtained a noticeable reduction of energy costs.

One example of an embodiment of the invention will now be explained in greater detail with reference to FIGS. 1 to 5 of the accompanying drawings, in which:

BRIEF DESCRIPTION OF THE DRAWINGS

FIG. 2 shows a cassette-like lower crucible element as used with the system as shown in FIG. 1, FIG. 3 shows a container-like lower crucible element as used with the system as shown in FIG. 1, FIG. 4 shows part of FIG. 1 on an enlarged scale, from which details of the multi-chamber upper crucible part and of the various lower crucible parts can be recognized, and FIG. 5 shows an automatic process controller for the system as shown in FIG. 1.

DETAILED DESCRIPTION OF THE INVENTION

Figure 1:
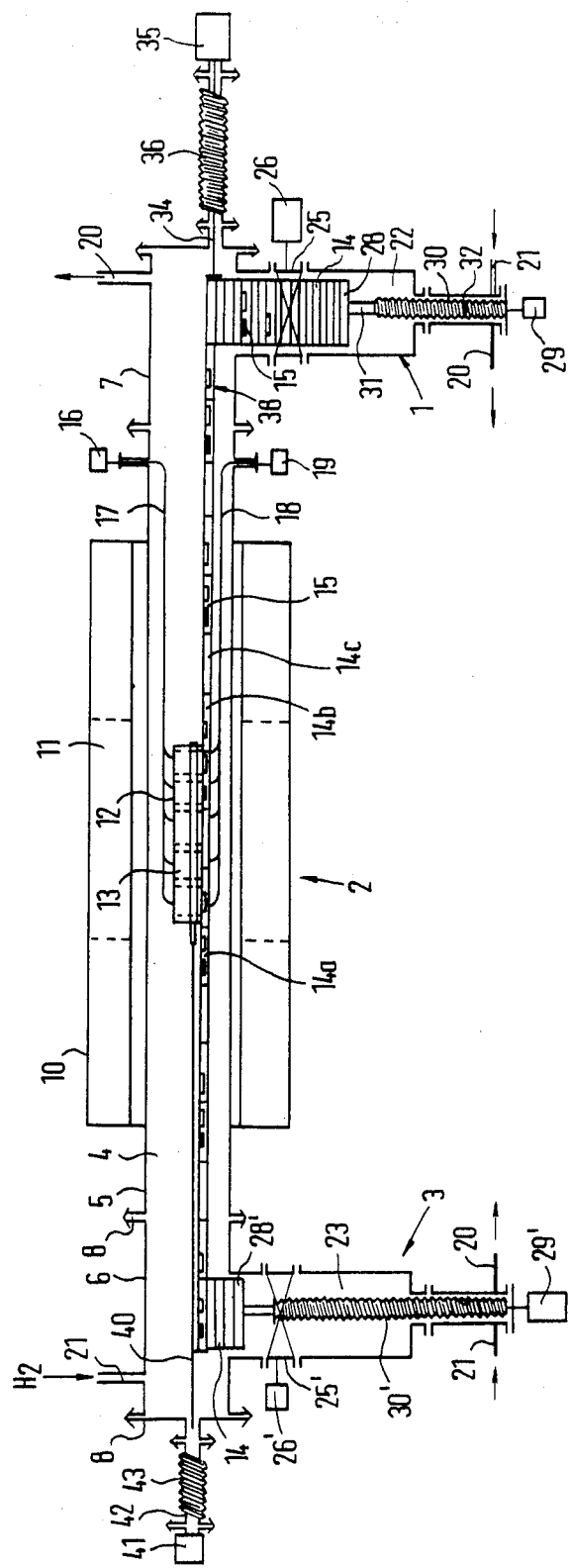
FIG. 1 shows a schematic system according to the invention.

The system, as shown in FIG. 1, for producing semiconductor layer structures by way of epitaxial growth consists of the following principal sections:

A loading area 1, an epitaxial-growth region 2 and an unloading area 3. A reaction space 4 is enclosed by an envelope of quartz glass 5 and by housing members of high-grade steel 6 and 7 which, on both end sides and at several connecting points, are connected among each other and to further parts of the system by means of sealing flanges as denoted in the drawing, such as by the flanges 8.

Within the epitaxial-growth region 2, the reaction space 4 is surrounded by a diffusion furnace 10 comprising three separately heatable temperature zones, of which in particular the temperature of the center zone 11 must be very exactly kept constant. Within the section including this center temperature zone 11, an upper crucible part 12, also known as an epitaxial boat, is disposed within the reaction space. This upper part 12 comprises several, e.g., five chambers 13 for taking up the coating or deposition substance solutions.

Below the upper crucible part 12, cassette-shaped lower crucible parts 14a are pushed i.e., (in the representation of FIG. 1) from right to left through the reaction space 4. They each contain a thin semiconductor slice or wafer 15 which successively comes to lie below the individual chambers 13 where it remains for the necessary crystallization period.

Following each of these lower parts 14a, a container-like lower crucible part 14b by which the used-up solution is removed, and a lower crucible part 14c serving as a spacer, are moved through the reaction space 4. Details of the multi-chamber upper crucible part 12 and of the various lower crucible parts 14a, 14b and 14c are explained in greater detail hereinafter with reference to FIGS. 2 to 4 of the drawings.

With the aid of a photosensor assembly consisting of a phototransmitter 16, of optical fibers 17 extending to the chambers 13 of the upper part 12, of the optical fibers 18 extending from the lower parts 14 disposed below the upper part 12, and of a photoreceiver 19, the individual lower parts 14a, 14b, 14c are each positioned exactly below the associated chamber 13.

Since the epitaxial process has to be carried out under a protective-gas atmosphere, the quartz tube 5 surrounding the reaction space, and the spaces of the loading area 1 and of the unloading area 3 as connected thereto, are provided with air-vent pipes 20 via which, within the reaction space 4, it is possible to produce an ultra-high vacuum. Via supply pipes 21, a protective gas, such as hydrogen, can be introduced into the loading area or the loading station 1 and into the unloading area or the unloading station 3.

The loading area 1 comprises a storage space or storage container 22 which is filled with a stack of lower crucible parts 14 which each contain an uncoated semiconductor wafer 15. The unloading area 3 is provided with a corresponding storage space 23 for taking up the lower parts 14 together with the semiconductor wafer 15 after the latter has been coated.

In order to prevent the reaction space 4 from coming into contact with surrounding atmosphere either during the filling of the storage space 22 or the emptying of the storage space 23—with all the disadvantageous interactions resulting therefrom—one airlock device 25, 25' each is inserted between the connections of the storage spaces 22 and 23 at the housing members 6, 7, with these airlock devices, for example, consisting of a high-grade steel pendulum slider or gate valve provided with an electropneumatic drive 26, 26'. Before the storage space 22 or 23 is opened or separated for the respective purposes of filling or emptying, the reaction space 4 is hermetically sealed with respect to the surrounding atmosphere by either the airlock device 25 or 25'.

From the storage space 22 the lower crucible parts 14 are pushed, with the aid of a piston 28, successively into the reaction space 4. For this purpose, the piston 28 is actuated by a drive 29 which, appropriately, is designed as a stepper motor. A high-grade steel bellows 30 seals the grommet through which the piston rod 31 passes through the housing 32 of the drive, against the surrounding atmosphere, so that the vacuum inside the reaction space 4 is maintained also when the airlock device 25 and the connected storage space 22 are opened.

The unloading area 3 likewise comprises a piston 28' with a drive 29', with the aid of which the individual lower parts 14 are removed from the reaction space 4 and introduced into the storage space 23. Here, too, a bellows 30' effects the necessary sealing with respect to the surroundings.

A push rod 34 which is capable of being moved to and fro, and an associated drive 35 in the form of a stepper motor, form a conveying device for pushing the lower crucible parts 14 through the reaction space 4. This push rod 34 is likewise sealed against the atmosphere by means of a high-grade steel bellows 36.

The lower parts 14 rest on a glideway or rail 38 extending from the loading area 1 up to the unloading area 3 through the reaction space 4. After the semiconductor wafers respectively placed below the upper crucible part 12 have been coated, the push rod 34 pushes the lower parts 14 by the length of one lower part to the left and then returns to its initial position. The piston 28 in the loading area is then moved in the upward direction and transfers a further lower part 14 up to the level of the slideway 38. The piston 28' of the unloading area 3 is moved in the downward direction, lowering the top one of the lower parts 14 lying on the stack, and thus making room for the next lower part 14 arriving on the slideway 38. This process is repeated until the storage space 22 within the loading area is empty, or until the storage space 23 is filled. After that, as already mentioned hereinbefore, the airlock devices 25 and 25' are closed, the storage space 22 is refilled with new semiconductor wafers 15, and the lower parts 14 with the readily coated semiconductor wafers 15 are removed from the storage space 23.

The vacuum or the protective gas atmosphere within the reaction space remains unaffected by the surrounding atmosphere during the loading and unloading of the storage spaces 22 and 23. Above all, however, there is no need for the diffusion furnace 10 to be cooled and reheated thereafter.

A drive 41 is connected to a slider in the upper crucible part 12 (cf. FIG. 4). With the aid of this slider, the portion of growth solution respectively required for one epitaxial coating can be separated from the contents of the chambers 13 and, moreover, the used-up portion of growth solution can be emptied into containerlike lower crucible part 14b. Also the passage through which the push rod 40 extends through the housing 42 of a drive is sealed against the atmosphere with the aid of a bellows 43.

The controllers of the individual aforementioned drives will be explained hereinafter.

The lower crucible part 14a as shown in FIG. 2 consists of a cassette-like housing 45 which is provided with a displaceable cover (lid) 46. One recess of the housing 45 takes up the semiconductor wafer 15 to be coated, and is covered by a slice 47 of e.g., indium phosphide (InP). By means of the cover 46 the protective gas may be prevented, during its entire stay within the reaction space 4, from acting upon the semiconductor wafer 15 or the InP slice 47, and from causing possible changes. The cover 46 is pushed aside as soon as the lower part 14 reaches the upper part 13. It is then received in a recess 48 as is indicated by the long arrow in the drawing.

The containerlike lower crucible part 14b as shown in FIG. 3 consists of a body 44 and of a recess 49 which respectively receives one portion of used-up growth solution and is moved out of the reaction space 4. The lower crucible parts 14c which are not shown in greater detail and which serve as spacers, merely consist of a body 44 without a recess.

Below the upper crucible part 12 (FIG. 4) there is positioned a cassette-shaped lower crucible part 14a containing a semiconductor wafer 15 to be coated. By means of a slider 70 which is actuated via the push rod 40, one portion 72 of the growth solution contained in the chambers 13 of the upper part 12, is respectively separated and used for applying an epitaxial growth layer onto the semiconductor wafer 15 lying thereabeneath. After that, the portion of growth solution 72 is used up and, after the lower crucible parts have been shifted toward the left, is taken up in the recess 49 of the containerlike lower crucible part 14b and can thus, without having to interrupt the epitaxial process, be removed from the reaction space 4.

While the semiconductor wafer 15 is conveyed from the loading area to the crucible 12 it is, as is already mentioned hereinbefore, protected by the cover 46 (cf. right-hand side of FIG. 4). No sooner than after the lower part 14a with the wafer 15 has reached the upper part 12, the cover 46 is stripped and drops into the recess 48.

FIG. 5, in a schematic representation, shows the most important constituent parts of the system according to the invention which have already been described hereinbefore with reference to FIG. 1. Identical parts are indicated by the same reference numerals and will not be explained again in greater detail. The system is provided with a modular type of controller which offers the advantage that the individual control modules can be more easily adapted to their respective tasks and can also be replaced in a more simple way. A process computer 50 coordinates the functions of the individual control modules and monitors the entire system. Via control and signal lines 51, computer 50 is connected to a valve spindle (leadscrew) 52 which controls the flow of the protective gas through the supply pipe 21, and to a positioning controller 53 which controls the drive 41 designed as a stepper motor. By the action of this drive, and via the push rod 40, the slider 70 is displaced which separates the portions of growth melt from the remaining contents of the chambers 13.

After several stacks of lower crucible parts 14a, 14b, 14c have passed through the reaction space, and the semiconductor wafers 15 as contained therein have been coated, the content of the chambers 13 is exhausted. At that point, the sealing flange 8 has to be opened and the upper crucible part has to be moved out and a new or newly filled upper crucible part 12 has to be moved into the reaction space. The necessary exact positional control is supervised with the aid of the photosensor assembly 16 to 19 (FIG. 1).

An air-lock controller 54 controls the electropneumatic drive 26' of the pendulum gate valve 25' within the unloading area 3.

A second positioning controller 55 controls the stepper motor of the drive 29' associated with the piston 28' of the unloading area or station 3.

Within the loading area 1, the drive 35 is controlled by a positioning controller 56, while the drive 26 is controlled by an airlock controller 57, and the drive 29 is controlled by a further positioning controller 58. Further control and signal lines 61 connect the process computer 50 to the just-mentioned control modules 56, 57 and 58 as well as to a valve spindle or lead screw 62 which controls the gas flow through the one or more vent pipes 20.

A sensor 64 of the photosensor assembly 17, 18, 19, which is connected via a signal line 63 to the process computer 50, reports the respective positions of the lower crucible parts 14 to the process computer 50.

A regulating circuit, only schematically denoted in the drawing, consists of three temperature-detector circuits 65 (one for each temperature zone of the diffusion furnace 10), of three PID (proportional, integral and derivative controller type) regulators 66 which are provided with a common time-program controller, and of three heater current setting circuits 67. It represents a very exactly controlling regulating circuit for regulating the temperature of the diffusion furnace 10, in the three zones of which the temperature is each time controlled independently. Within the reaction range of the diffusion furnace, the temperature must be kept constant with an admissible tolerance at the most of ±0.5°.

The described controller permits a quasi-continuous process execution resulting in a high throughput rate and an exact reproducibility of the epitaxial layers. Moreover, the system results in a high productivity rate owing to the fact that it is capable of treating the undivided semiconductor wafers in the state as supplied by the manufacture, in their original sizes with e.g., two inch diameters. There is no longer any need for the wafers to be previously cut through.

While we have described above the principles of our invention in connection with specific apparatus, it is to be clearly understood that this description is made only by way of example and not as a limitation to the scope of our invention as set forth in the objects thereof and in the accompanying claims.

We claim:
1. A system for producing semiconductor layer structures by way of epitaxial growth from a molten coating substances, which comprises:
   at least one crucible having a lower part which holds the uncoated semiconductor wafer, and an upper part which holds the coating substances, said upper part being displaceable relative to the lower part;
   said system having a reaction space into which the crucible is introduced and retained under a protective gas atmosphere;
   a furnace in proximity to the reaction space for heating the crucible while in the reaction space to the temperature necessary for effecting epitaxial growth, and
   a conveyor extending through the reaction space and by which one of the crucible parts is displaced relative to the other, in the course of which the semiconductor wafer is brought into contact with the required molten coating substance, wherein the improvement comprises:
   said system having a loading area in which several lower crucible parts together with the semiconductor wafers are introduced into the reaction space and are successively fed to the conveyor,
   an epitaxial-growth region in the reaction space which is capable of being heated by the furnace, through which the lower crucible parts are successively moved in a step-by-step manner,
   an upper crucible part which is stationarily arranged within the epitaxial-growth region, below which the lower parts are passed in such a way that each semiconductor wafer comes into contact with the contents of one or more chambers of the upper part during a predetermined period of time,
   an unloading area lying in the conveying direction behind the epitaxial-growth region, in which the lower crucible parts are removed from the reaction space,
   a first airlock through which lower crucible parts pass prior to introduction into the reaction space for preventing the atmosphere surrounding said system from entering the reaction space through the loading area, and
   a second airlock through which lower crucible parts pass after removal form the reaction space for preventing the atmosphere surrounding said system from entering the reaction space through the unloading area.

2. A system as claimed in claim 1, further comprising a process controller automatically controlling, in a manner tuned to one another, a first driving mechanism for introducing lower crucible parts within the loading area to the reaction space, a second driving mechanism for moving the conveyor to convey lower crucible parts through the epitaxial-growth region, and a third driving mechanism for removing lower crucible parts within the reaction space to the unloading area.

3. A system as claimed in claim 2, wherein the individual driving mechanisms are each provided with a control module of their own, and these control modules are connected to the process controller via control and signal lines.

4. A system as claimed in claim 1, wherein said loading and said unloading areas are each provided with a space for accommodating several lower crucible parts and said first and second airlocks are within said loading and said unloading areas, respectively.

5. A system as claimed in claim 1, wherein the crucible comprises cassette-shaped lower parts, in each of which one semiconductor wafer passes through the system.

6. A system as claimed in claim 1, wherein the cassette-shaped lower part comprises a displaceable cover.

7. A system as claimed in claim 1, wherein the crucible comprises container-like lower parts for removing the used-up epitaxial solution from the reaction space.

8. A system as claimed in claim 7, wherein the crucible comprises lower parts serving as spacers between the cassette-shaped and the container like lower parts.

* * * * *

UNITED STATES PATENT AND TRADEMARK OFFICE
CERTIFICATE OF CORRECTION

PATENT NO. : 4,782,785

DATED : November 8, 1988

INVENTOR(S) : Bernhard Gohla and Richard Linnebach

It is certified that error appears in the above-identified patent and that said Letters Patent is hereby corrected as shown below:

Title page:

In [75], the correct spelling of the first inventor's name is --Bernhard Gohla--.

Signed and Sealed this

Fourth Day of April, 1989

Attest:

Attesting Officer

DONALD J. QUIGG

Commissioner of Patents and Trademarks